United States Patent
Riera Cercado et al.

(10) Patent No.: US 12,136,601 B1
(45) Date of Patent: Nov. 5, 2024

(54) SINGLE-SIDED EMBEDDABLE CAPACITORS FOR PACKAGED SEMICONDUCTOR DEVICES

(71) Applicant: Saras Micro Devices, Inc., Chandler, AZ (US)

(72) Inventors: Carlos Andres Riera Cercado, Atlanta, GA (US); Jose F. Solis Camara, Atlanta, GA (US)

(73) Assignee: SARAS MICRO DEVICES, INC., Chandler, AZ (US)

(*) Notice: Subject to any disclaimer, the term of this patent is extended or adjusted under 35 U.S.C. 154(b) by 0 days.

(21) Appl. No.: 18/618,869

(22) Filed: Mar. 27, 2024

(51) Int. Cl.
- *H01L 23/64* (2006.01)
- *H01L 23/538* (2006.01)
- *H01L 25/065* (2023.01)
- *H01L 49/02* (2006.01)
- *H10B 80/00* (2023.01)

(52) U.S. Cl.
CPC ........ *H01L 23/642* (2013.01); *H01L 23/5383* (2013.01); *H01L 25/0652* (2013.01); *H01L 28/40* (2013.01); *H10B 80/00* (2023.02)

(58) Field of Classification Search
CPC .............. H01L 23/642; H01L 23/5383; H01L 25/0652; H01L 28/40
See application file for complete search history.

(56) References Cited

U.S. PATENT DOCUMENTS

| | | | |
|---|---|---|---|
| 6,525,921 B1* | 2/2003 | Nakatani | H05K 1/162 361/306.3 |
| 2018/0374843 A1* | 12/2018 | Muri | H01L 21/76898 |
| 2023/0006788 A1 | 3/2023 | Sundaram et al. | |
| 2024/0021372 A1 | 1/2024 | Timms et al. | |

OTHER PUBLICATIONS

Micromachines. "Focused Electron Beam-Based 3D Nanoprinting forScanning Probe Microscopy: A Review;" Harold Plank et al.; http://www.mdpi.com/journal/micromachines.

* cited by examiner

*Primary Examiner* — Evren Seven
(74) *Attorney, Agent, or Firm* — Stetina Brunda Garred & Brucker

(57) ABSTRACT

A capacitor embeddable in a substrate core of a semiconductor device comprises a conductive substrate having a front side and a back side, a dielectric layer on the front side of the conductive substrate, a conductive polymer layer on the dielectric layer, a carbonaceous layer on the conductive polymer layer, a front metallization layer on the carbonaceous layer and electrically connected to the conductive polymer layer, and a back metallization layer on the back side of the conductive substrate and electrically connected to the conductive substrate. The conductive polymer layer, the carbonaceous layer, and the front metallization layer may define a plurality of electrically isolated stacks on the front side of the conductive substrate.

20 Claims, 6 Drawing Sheets

SINGLE-SIDED EMBEDDABLE CAPACITORS FOR PACKAGED SEMICONDUCTOR DEVICES

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present disclosure relates generally to integrated circuits (ICs) and, more particularly, to package substrates and interposers for packaged semiconductor devices containing passive components embedded in a substrate core thereof.

Capacitors are an important part of many integrated and embedded circuits and are commonly used as energy storage structures, filters, or as specific components of complex circuits. Capacitors generally make use of high surface area to achieve high capacitance values and are commonly arranged as a pair of thin electrodes separated by a dielectric and rolled into a tight cylindrical structure to optimize the surface area per unit volume. They are also made as deep trenches in silicon to benefit from more surface area, or as layers of dielectric and metal stacked and connected to each other to benefit from both permittivity and surface area.

Efforts to maximize capacitance and minimize equivalent series resistance (ESR) of capacitors have led to the development of double-sided capacitors such as those described in Applicant's own U.S. Patent Application Pub. No. 2023/0067888 ("the '888 publication"), entitled "Planar High-Density Aluminum Capacitors for Stacking and Embedding," and U.S. Patent Application Pub. No. 2024/0021372 ("the '372 publication"), entitled "Pre-Drilled Vias to capture Double Sided Capacitance," the entire contents of each of which is incorporated by reference herein. Such arrangements may define a second electrode (e.g., a cathode), such as a conductive polymer, metal, or ceramic, that is disposed on both sides of a first electrode (e.g., an anode) made of aluminum that has been etched or otherwise modified to have a high surface area, with an oxide layer formed therebetween to act as the dielectric. Such double-sided capacitors have the potential to double the usable surface area of the first electrode and, thus, double the capacitance relative to conventional devices. However, formation of through vias that are used in such devices for accessing cathode and anode terminals from both top and bottom may require additional time-consuming process steps or may generate heat (due to laser drilling, for example), which may lower the conductivity of the second electrode material, increasing the ESR of the capacitor. In the worst case, debris and mechanical tensions caused by via formation may lead to delamination or fracture, resulting in device failure.

Moreover, thinner and vertically integrated embedded passive devices may be needed in order to push volumetric densities and form-factors for future power modules. For example, thinner devices may be needed to address DC-DC conversion challenges where monolithic approaches are not going to meet the long-term volumetric density requirements of voltage regulators, for example, in High Power Computing applications.

BRIEF SUMMARY

The present disclosure contemplates various devices and methods for overcoming the above drawbacks accompanying the related art. One aspect of the embodiments of the present disclosure is a capacitor embeddable in a substrate core of a semiconductor device. The capacitor may comprise a conductive substrate having a front side and a back side, a dielectric layer on the front side of the conductive substrate, a conductive polymer layer on the dielectric layer, a carbonaceous layer on the conductive polymer layer, a front metallization layer on the carbonaceous layer and electrically connected to the conductive polymer layer, and a back metallization layer on the back side of the conductive substrate and electrically connected to the conductive substrate.

The conductive polymer layer, the carbonaceous layer, and the front metallization layer may define a plurality of electrically isolated stacks on the front side of the conductive substrate. The dielectric layer may be conformal with a high surface area (HSA) portion of the conductive substrate on the front side of the conductive substrate. The back metallization layer may be on a solid metal portion of the conductive substrate on the back side of the conductive substrate.

Another aspect of the embodiments of the present disclosure is a substrate of a semiconductor device. The substrate may comprise a substrate core and a capacitor embedded in the substrate core. The capacitor may include a conductive substrate having a front side and a back side, a dielectric layer on the front side of the conductive substrate, a conductive polymer layer on the dielectric layer, a carbonaceous layer on the conductive polymer layer, a front metallization layer on the carbonaceous layer and electrically connected to the conductive polymer layer, and a back metallization layer on the back side of the conductive substrate and electrically connected to the conductive substrate.

The conductive polymer layer, the carbonaceous layer, and the front metallization layer may define a plurality of electrically isolated stacks on the front side of the conductive substrate. The dielectric layer may be conformal with a high surface area (HSA) portion of the conductive substrate on the front side of the conductive substrate. The back metallization layer may be on a solid metal portion of the conductive substrate on the back side of the conductive substrate. The substrate may be a package substrate of the semiconductor device. The substrate may be an interposer of the semiconductor device.

Another aspect of the embodiments of the present disclosure is a method of manufacturing a capacitor embeddable in a substrate core of a semiconductor device. The method may comprise providing a conductive substrate having a front side and a back side, providing a conductive polymer layer on a dielectric layer formed on the front side of the conductive substrate, providing a carbonaceous layer on the conductive polymer layer, providing a front metallization layer on the carbonaceous layer, and providing a back metallization layer on the back side of the conductive substrate. The front metallization layer may be electrically connected to the conductive polymer layer, and the back metallization layer may be electrically connected to the conductive substrate.

The dielectric layer may be conformal with a high surface area (HSA) portion of the conductive substrate on the front side of the conductive substrate. The method may comprise removing a high surface area (HSA) portion of the conductive substrate from the back side of the conductive substrate, the back metallization layer being provided on a solid metal portion of the conductive substrate on the back side of the conductive substrate. The semiconductor device may comprise a package substrate that includes the substrate core. The semiconductor device may comprise an interposer that includes the substrate core.

The method may comprise removing the HSA portion of the conductive substrate in one or more regions of the front side of the conductive substrate to produce a plurality of isolated islands of the HSA portion having the dielectric layer conformal therewith and providing a plurality of electrically isolated stacks respectively on the plurality of isolated islands, each of the stacks including a portion of the conductive polymer layer, a portion of the carbonaceous layer, and a portion of the front metallization layer. The method may comprise applying a dielectric fill (e.g., photoresist) between the plurality of isolated islands. Providing the plurality of electrically isolated stacks may comprise applying a continuous conductive polymer layer, a continuous carbonaceous layer, and a continuous front metallization layer over the plurality of isolated islands and subsequently removing one or more portions of the continuous conductive polymer layer, the continuous carbonaceous layer, and the continuous front metallization layer between the plurality of isolated islands. Providing the plurality of electrically isolated stacks may alternatively (or additionally) comprise selectively applying the conductive polymer layer, the carbonaceous layer, and the front metallization layer on the plurality of isolated islands.

Alternatively (or additionally), the method may comprise removing the HSA portion of the conductive substrate, the conductive polymer layer, the carbonaceous layer, and the front metallization layer in one or more regions of the front side of the conductive substrate to produce a plurality of isolated stacks.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The present disclosure encompasses various embodiments of capacitors embeddable into a substrate core of a semiconductor device, along with methods of manufacture thereof. The detailed description set forth below in connection with the appended drawings is intended as a description of several currently contemplated embodiments and is not intended to represent the only form in which the disclosed subject matter may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
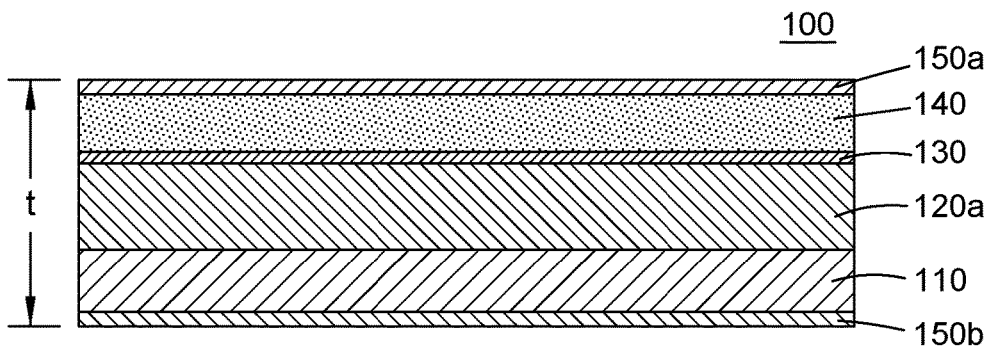
FIG. 1 is a cross-sectional view of a capacitor that may be embedded into a substrate core of a semiconductor device.
Figure 10:
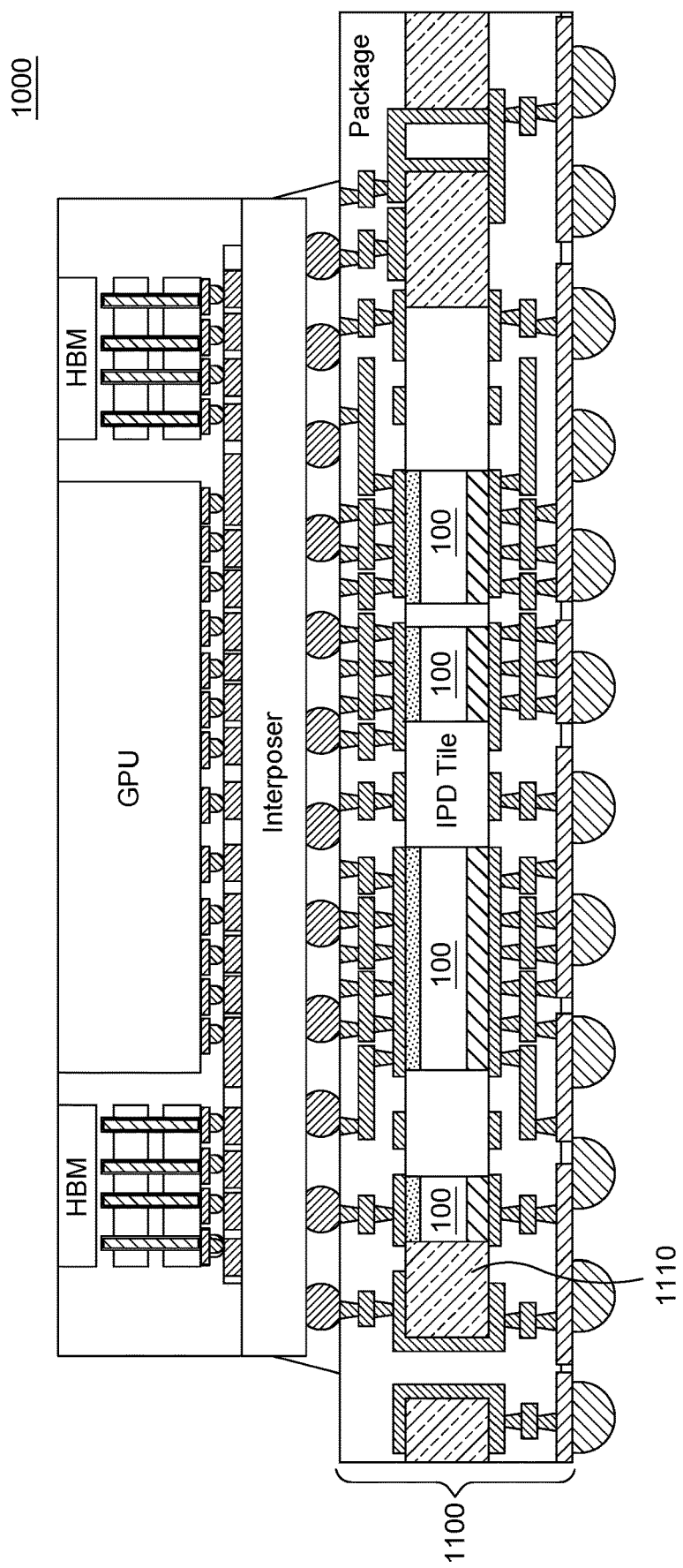
FIG. 10 is a cross-sectional view of a packaged semiconductor device including an embedded capacitor in a package substrate thereof.
Figure 11:
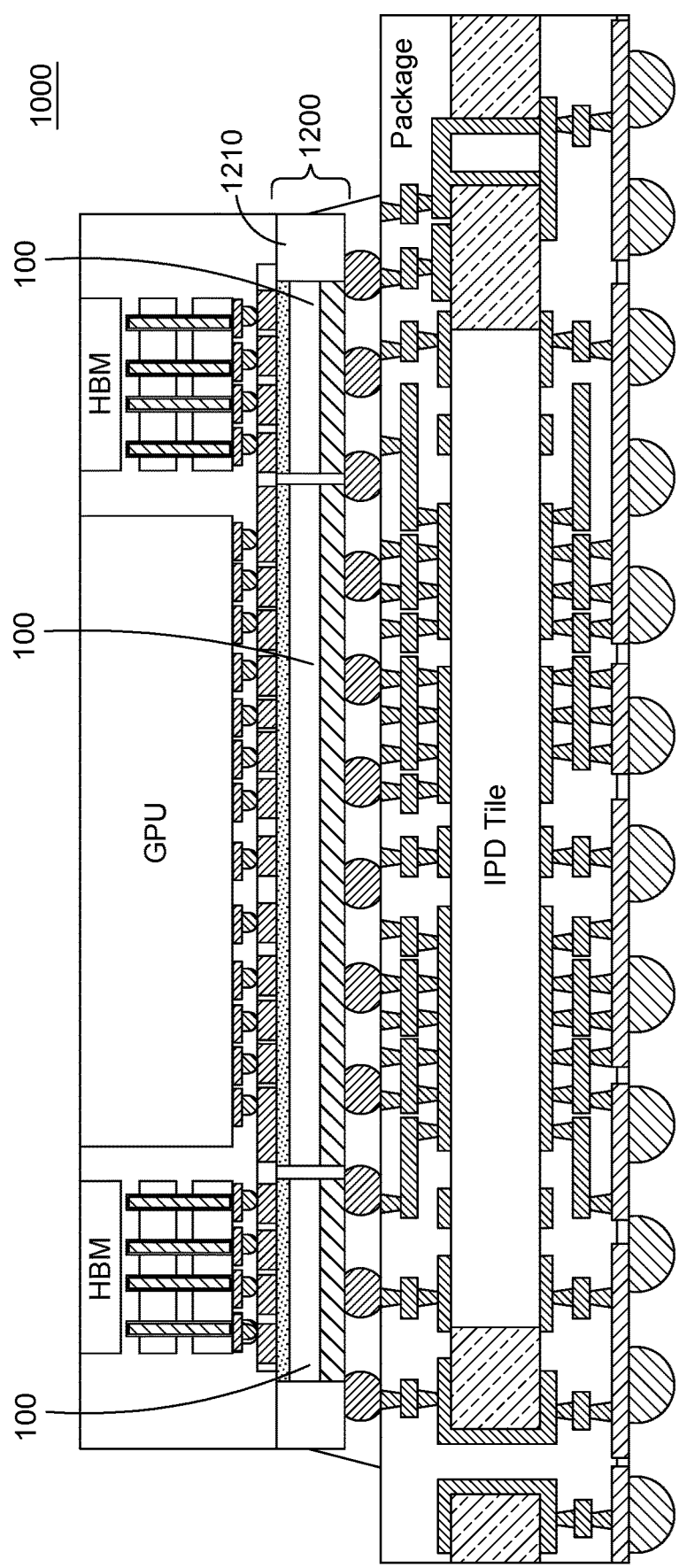
FIG. 11 is a cross-sectional view of a packaged semiconductor device including an embedded capacitor in an interposer thereof.

FIG. 1 is a cross-sectional view of a capacitor 100. As represented in FIGS. 10 and 11, one or more such capacitors 100 may thereafter be conveniently embedded into a substrate core of a semiconductor device 1000, such as a substrate core 1110 of a package substrate 1100 for an integrated circuit (e.g., GPU/AI with HBM memory) as represented in FIG. 10 or a substrate core 1210 of an interposer 1200 as represented in FIG. 11. The capacitor 100 may comprise a conductive substrate 110 serving as a first electrode (e.g., anode), which may be made of aluminum, an aluminum alloy, or another material (e.g., tantalum) that is etched or otherwise modified to have a high surface area, such as an etched aluminum foil as described in the '888 publication. The capacitor 100 may further comprise a dielectric layer 120*a* on a front side of the conductive substrate 110, a conductive polymer layer 130 on the dielectric layer 120*a*, a carbonaceous layer 140 on the conductive polymer layer 130, a front metallization layer 150*a* on the carbonaceous layer 140, and a back metallization layer 150*b* on a back side of the conductive substrate 110, opposite the front side. The front metallization layer 150*a* may be electrically connected to the conductive polymer layer 130, which may serve as a second electrode (e.g., cathode), whereas the back metallization layer 150*b* may be electrically connected to the conductive substrate 110 serving as the first electrode (e.g., anode). Advantageously, unlike double-sided capacitors that require anode and cathode connections on both top and bottom or require access to both sides of the device from one side, the single-sided topology of the disclosed capacitor 100 may allow for a top-to-bottom connection in which the first electrode (e.g., anode) is accessed from the bottom while the second electrode (e.g., cathode) is accessed from the top. Due to the nature of the resulting vertical capacitor structure where the signal passes from the top (e.g., cathode) to the bottom (e.g., anode), the need for the formation of through vias may be avoided. Moreover, the single-sided topology of the capacitor 100 may allow the device profile to be minimized, addressing the need for thinner and vertically integrated embedded passive devices to push volumetric densities and form-factors for future power modules. The thickness t of the capacitor 100 may in some cases be 90 μm or less or even 75 μm or less, making the capacitor 100 usable as an embedded high capacitance density solution at the interposer level or for landside applications for High Power Computing.

More specifically, the conductive substrate 110 of the capacitor 100 may comprise a solid metal portion (represented by reference number 110) and a high surface area (HSA) portion on the front side thereof, which may include the dielectric layer 120a conformal therewith. The dielectric layer 120a may be a naturally occurring oxide layer (e.g., an aluminum oxide layer) or one that has been grown by an anodization process (e.g., by placing the conductive substrate 110 including the HSA portion in an electrolytic solution and passing a current through the solution), grown by thermal oxidation in a humidity chamber, or coated on the HSA portion of the conductive substrate 110 (e.g., by atomic layer deposition). As may be appreciated, the dielectric layer 120a may, in general, exhibit the same high surface area as the underlying HSA portion of the conductive substrate 110 as it fills in and takes the shape of the various tunnels and recesses that may result from the etching or other modification to the material of the conductive substrate 110.

The conductive polymer layer 130 may likewise be provided conformal with the HSA portion of the conductive substrate 110, so as to be electrically isolated from the conductive substrate 110 by the dielectric layer 120a. In particular, the conductive polymer layer 130 may exhibit the same high surface area as the underlying conductive substrate 110 as it fills in and takes the shape of the various tunnels and recesses that may result from the etching or other modification to the material of the conductive substrate 110, with the dielectric layer 120a sandwiched therebetween. In the illustrated capacitor 100, only the portion of the conductive polymer layer 130 that extends past the HSA portion is shown. The conductive polymer layer 130 may serve as the second electrode (e.g., cathode) of the capacitor 100, with the conductive substrate 110 serving as the first electrode (e.g., anode). A variety of conductive polymers may be suitable for use as the conductive polymer layer 130 serving as the second electrode of the capacitor 100 described herein. The conductive polymer layer may, for example, comprise one or more of a polypyrrole, a polythiophene, a polyaniline, a polyacetylene, a polyphenylene, a poly(p-phenylene-vinylene), PEDOT: PSS (poly(3,4-ethylenedioxythiophene) polystyrene sulfonate), or P3HT (poly (3-hexylthiophene-2,5-diyl)). In some cases, TiN or Pt may be used in place of the conductive polymer.

In addition to the dielectric layer 120a and the conductive polymer layer 130 serving as the second electrode (e.g., cathode), the capacitor 100 may include additional layers on the conductive polymer layer 130 in order to improve the electrical connection between the conductive polymer layer 130 and an external circuit. In this regard, the carbonaceous layer 140 (e.g., a carbon ink) and/or the front metallization layer 150a (e.g., Ag or Ti/Cu) may be applied on the conductive polymer layer 130. The carbonaceous layer 140 may be applied in direct, physical contact with the conductive polymer layer 130, and the front metallization layer 150a may be applied on the conductive polymer layer 130 by being in direct, physical contact with the carbonaceous layer 140 thereon. Preferably, the application of the front metallization layer 150a may comprise depositing a diffusion barrier on the carbonaceous layer 140 and depositing metal adjacent the diffusion barrier.

The carbonaceous layer 140, if included, may advantageously reduce a contact resistance between the conductive polymer layer 130 and other components, such as a diffusion barrier layer of the front metallization layer 150a. The carbonaceous layer 140 may include, for example, carbon black, graphite, a carbon-based ink, or a polymeric, and may be applied using a variety of techniques, such as screen printing, inkjet printing, sputter deposition, vacuum deposition, spin coating, doctor blading, or the like. The front metallization layer 150a may be used to provide high-quality electrical conductivity between the conductive polymer layer 130 (acting as the second electrode of the capacitor 100) and metal terminal(s) for connecting the capacitor 100 to an external circuit, for example. The front and back metallization layers 150a, 150b may include a metal such as Ag, Au, Cu, Pt, Pd, and/or composites or alloys of the aforementioned metals, or in some cases polymers such as epoxies, silicones, or fluoroclastomers. Including a diffusion barrier layer in the front metallization layer 150a may limit infiltration of components from the front metallization layer 150a into the carbonaceous layer 140 or conductive polymer layer 130. Example materials for a diffusion barrier layer include, but are not limited to, Ti, W, Cr, Ti—W, TaN, and/or Co—W. The front and back metallization layers 150a, 150b, as well as any diffusion barrier layer thereof, may be applied using any suitable techniques, such as vacuum deposition (e.g., sputter deposition) or physical vapor deposition (e.g., PVD).

Figure 2:
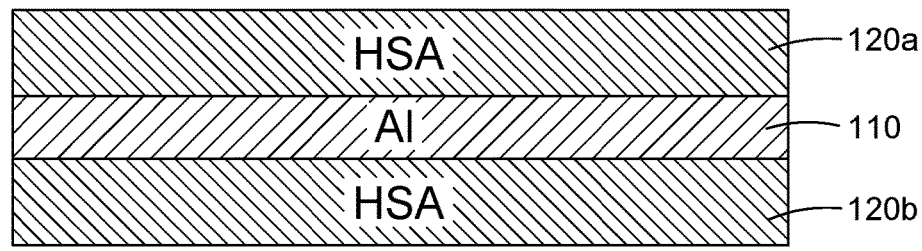
FIG. 2 is a cross-sectional view of a processing stage in manufacturing the capacitor.
Figure 3:
FIG. 3 is a cross-sectional view of another processing stage in manufacturing the capacitor.
Figure 4:
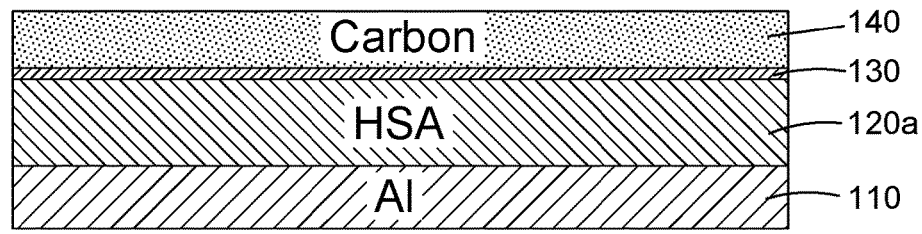
FIG. 4 is a cross-sectional view of another processing stage in manufacturing the capacitor.

Referring to FIG. 2, an example process flow for manufacturing the capacitor 100 may begin with providing the conductive substrate 110, which may initially have the HSA portion on both front and back sides as well as both front and back dielectric layers 120a, 120b conformally formed therein. As depicted in FIG. 3, the HSA portion, along with the aluminum oxide or other dielectric layer 120b, may then be removed from the back side, e.g., by wet or dry etching, which may be followed by single side coating steps to build up the layers of the capacitor 100 on only the front side of the conductive substrate 110. FIG. 4 shows a stage of the process flow after the conductive polymer layer 130 and the carbonaceous layer 140 have been applied. The process flow may conclude with application of the front and back metallization layers 150a, 150b as shown in FIG. 1.

Figure 5A:
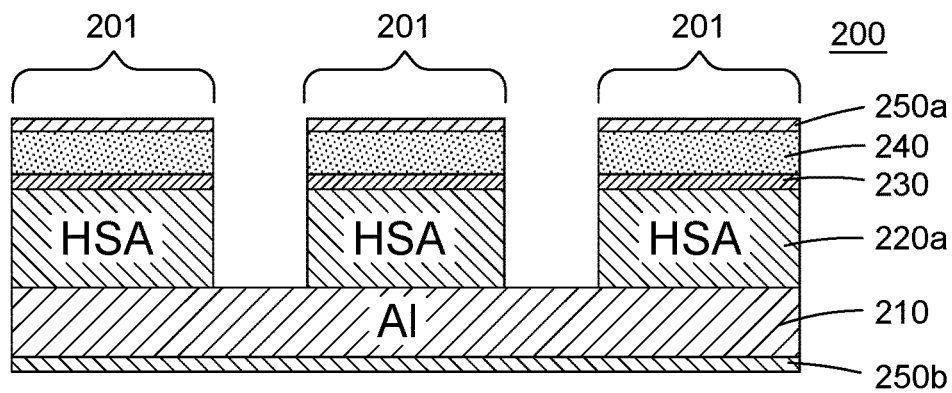
FIG. 5A is a cross-sectional view of another capacitor that may be embedded into a substrate core of a semiconductor device.
Figure 12:
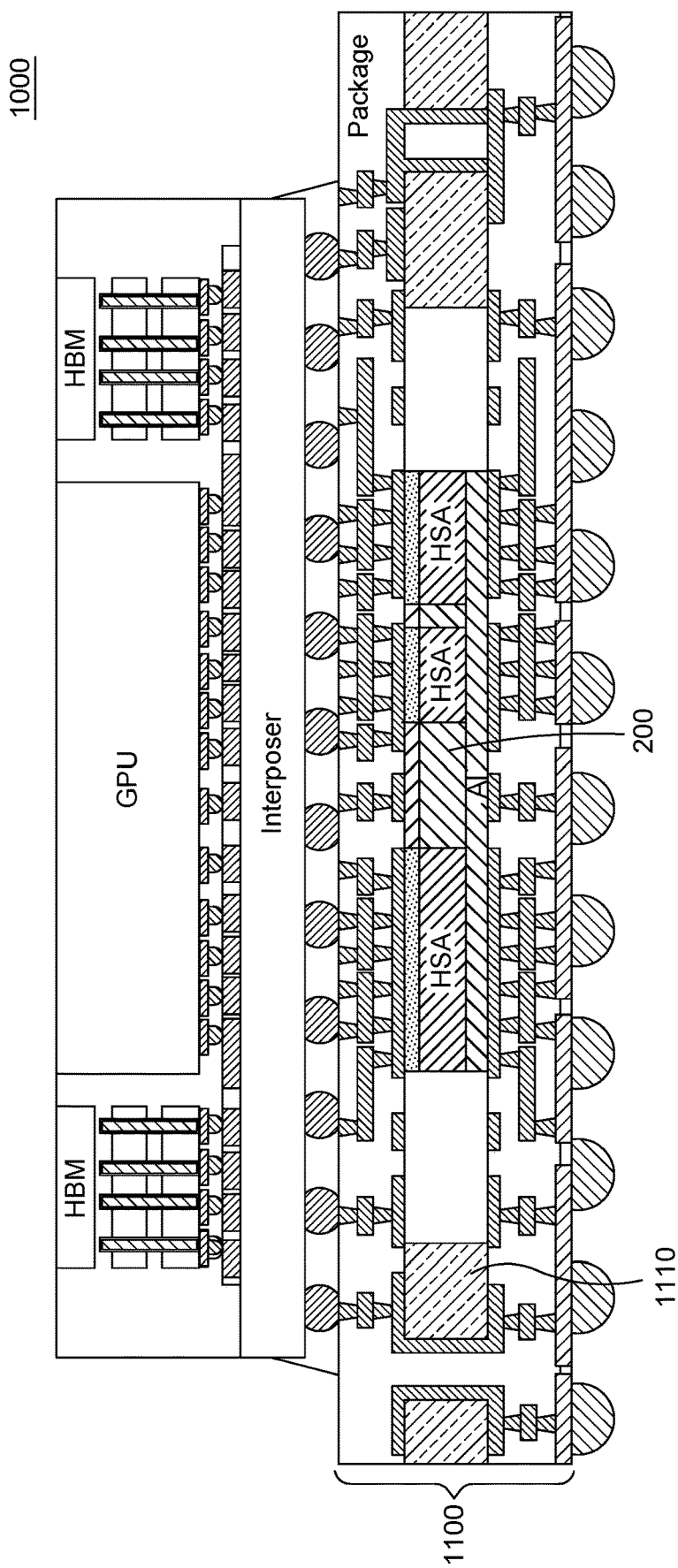
FIG. 12 is another cross-sectional view of a packaged semiconductor device including an embedded capacitor in a package substrate thereof.

FIG. 5A is a cross-sectional view of another capacitor 200 that may be embedded into a substrate core of a semiconductor device 1000 (see FIGS. 10-12). The capacitor 200 may be the same as the capacitor 100 except as described herein. In particular, the capacitor 200 may comprise a conductive substrate 210, front dielectric layer 220a, conductive polymer layer 230, carbonaceous layer 240, and front and back metallization layers 250a, 250b that are the same as the conductive substrate 110, front dielectric layer 120a, conductive polymer layer 130, carbonaceous layer 140, and front and back metallization layers 150a, 150b except that the conductive polymer layer 230, the carbonaceous layer 240, and the front metallization layer 250a may define a plurality of electrically isolated stacks 201 on the front side of the conductive substrate 210. As shown in the top view of FIG. 5B, the electrically isolated stacks 201 may have different shapes and sizes. By virtue of the electrically isolated stacks 201, the conductive polymer layer 230 serving as the second electrode (e.g., cathode) may advantageously define a plurality of different voltage domains (e.g., corresponding to a plurality of cathodes) with respect to the shared conductive substrate 210 serving as the first electrode (e.g., anode). In comparison with double-sided approaches to producing multiple voltage domains, the capacitor 200 may eliminate inductive loops, resulting in improved equivalent series inductance (ESL).

Figure 6:
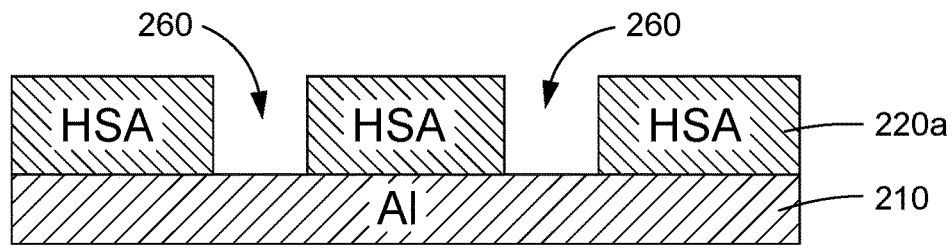
FIG. 6 is a cross-sectional view of a processing stage in manufacturing the capacitor of FIG. 5A.
Figure 7:
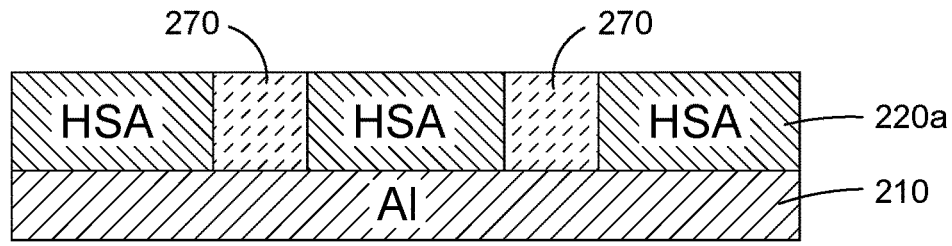
FIG. 7 is a cross-sectional view of another processing stage in manufacturing the capacitor of FIG. 5A.

The process flow for manufacturing the capacitor 200 may be the same as described above in relation to the capacitor 100 except as follows. An example process flow may similarly begin with providing the conductive substrate 210, which may initially have the HSA portion on both front and back sides as well as both front and back dielectric layers conformally formed therein, after which the HSA portion, along with the aluminum oxide or other dielectric layer, may then be removed from the back side, e.g., by wet or dry etching, leaving only the front dielectric layer 220a. In this regard, FIGS. 2 and 3 may be equally representative of a process flow for manufacturing the capacitor 200, with the conductive substrate 210 and front dielectric layer 220a corresponding to the conductive substrate 110 and front dielectric layer 120a of those figures. In the case of the capacitor 200, the process flow may continue as shown in FIG. 6 with removing the HSA portion of the conductive substrate 210 (containing the front dielectric layer 220a) in one or more regions 260 of the conductive substrate 210 to produce a plurality of isolated islands of the HSA portion. A dielectric fill 270 may then be applied between the plurality of isolated islands as shown in FIG. 7. The dielectric fill 270 may comprise a photoresist or other material, preferably one that is easily removed and has a low viscosity, allowing it to enter the pores of the HSA portion to prevent infiltration of the layer buildup on the sides of the isolated islands.

Figure 8:
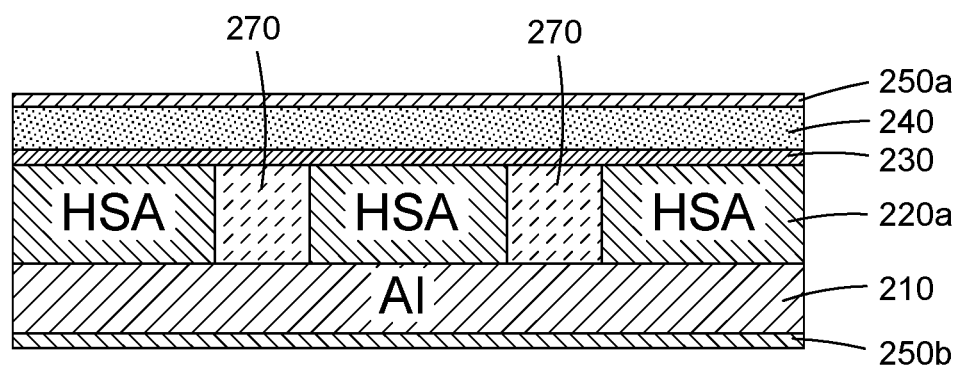
FIG. 8 is a cross-sectional view of another processing stage in manufacturing the capacitor of FIG. 5A.
Figure 9:
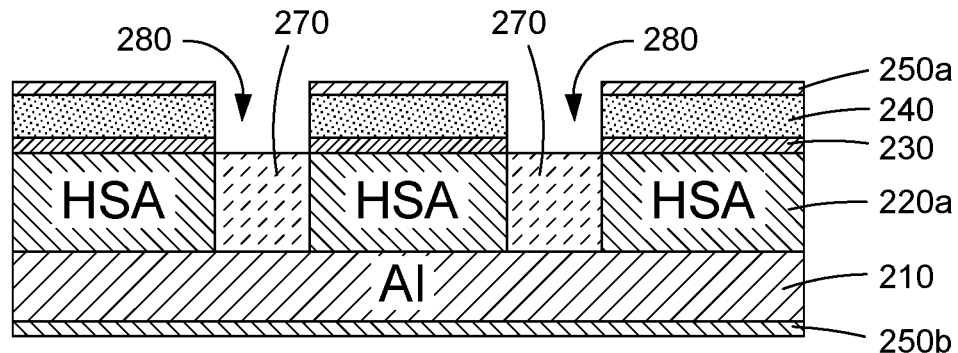
FIG. 9 is a cross-sectional view of another processing stage in manufacturing the capacitor of FIG. 5A.

Referring to FIG. 8, the process may proceed with single side coating steps of the conductive polymer layer 230 and carbonization layer 240 on only the front side of the conductive substrate 210, just as described in relation to the capacitor 100, followed by application of the front and back metallization layers 250a, 250b. In particular, as shown in FIG. 8, a continuous conductive polymer layer 230, a continuous carbonaceous layer 240, and a continuous front metallization layer 250a may be provided over the plurality of isolated islands (and over the dielectric fill 270 if included). Subsequently, as shown in FIG. 9, one or more portions of the continuous conductive polymer layer 230, the continuous carbonaceous layer 240, and the continuous front metallization layer 250a may be removed between the plurality of isolated islands to produce gaps 280, for example, by laser processing. Lastly, the dielectric fill 270 may be removed to produce the capacitor 200 having the electrically isolated stacks 201 as shown in FIGS. 5A and 5B.

Referring back to FIG. 7, an alternative process for providing the plurality of electrically isolated stacks 201 of the capacitor 200 may comprise selectively applying the conductive polymer layer 230, the carbonaceous layer 240, and the front metallization layer 250a on the plurality of isolated islands of the HSA portion. For example, using masks and screen-printing methods, the layers 230, 240, and 250a may be built up individually on each island rather than as continuous layers extending over the entire conductive substrate 210. In this way, the manufacturing stage shown in FIG. 9 may proceed directly from the manufacturing stage shown in FIG. 9 without the intervening manufacturing stage shown in FIG. 8, thus avoiding expensive and potentially destructive laser processing. The dielectric fill 270 may then be removed to produce the capacitor 200 having the electrically isolated stacks 201 as shown in FIGS. 5A and 5B.

Figure 5B:
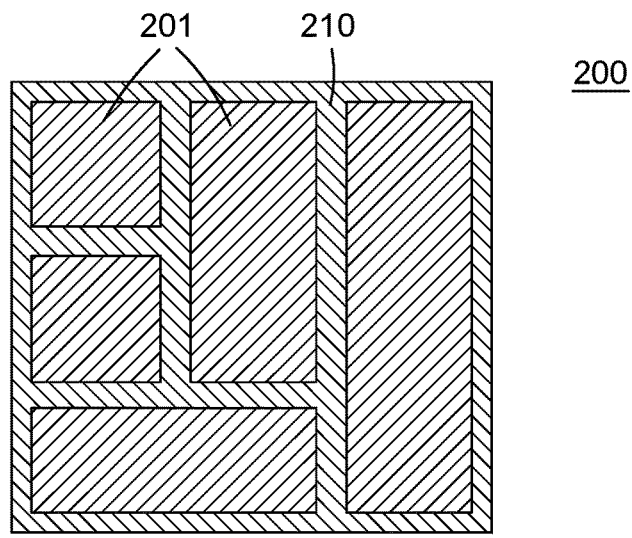
FIG. 5B is a top view of the capacitor of FIG. 5A.

A further alternative process for providing the electrically isolated stacks 201 of the capacitor 200 may proceed directly from the finished capacitor 100 shown in FIG. 1 to the finished capacitor 200 shown in FIGS. 5A and 5B. In particular, the HSA portion of the conductive substrate 110 (including the conformal dielectric layer 120a), the conductive polymer layer 130, the carbonaceous layer 140, and the front metallization layer 150a may be removed in one or more regions of the front side of the conductive substrate 110 (e.g., by wet etching or laser isolation) to produce the plurality of isolated stacks 201, resulting in the capacitor 200 with multiple voltage domains shown in FIGS. 5A and 5B.

The finished capacitor 100, 200 produced by any of the above process flows may then be embedded in the substrate core 1110 of a package substrate 1100 as shown in FIGS. 10 and 12 (e.g., a flip-chip BGA package as illustrated), with the front and back metallization layers 150a, 150b, 250a, 250b being electrically connected to metal routing layers of the package substrate 1100, for example. The connection to the package substrate 1100 can be lateral using plating (e.g., copper plating) from the capacitor 100, 200 to a metal (e.g., copper) plane on the substrate core 1110, with the plating extending over an intervening anchoring epoxy in some cases. Alternatively, or in addition, the connections to the package substrate 1100 can be through vias to subsequent build-up layers. FIG. 10 shows an example in which several of the capacitor 100 are embedded into the substrate core 1110, while FIG. 12 shows an example in which a single capacitor 200 (having multiple voltage domains but sharing a common anode, for example) is embedded into the substrate core 1110. FIG. 11 illustrates that one or more of the capacitor 100 (or capacitor 200, though not separately illustrated) may likewise be embedded into the substrate core 1210 of the interposer 1200, as may be made possible by the thin profiles of the capacitors 100, 200 described herein. Advantageously, the described capacitors 100, 200 may allow for the decoupling of higher frequency bands using thinner capacitors for land-side applications at the interposer level, paving the way for on-die DC-DC converters where monolithic approaches might not meet the long-term requirements of integrated voltage regulators (IVRs). By providing a shorter path and thus decreasing parasitics, the disclosed innovations may address some of the key challenges for IVR integration closer to the load.

Especially owing to their thin profiles, it is additionally contemplated that the capacitors 100, 200 may be vertically stacked for increased capacitance and lower ESR. In this regard, the process flows for manufacturing the capacitor 100 or the capacitor 200 may be combined with capacitor stacking processes as described in Applicant's own U.S. patent application Ser. No. 18/497,808, filed Oct. 30, 2023 and entitled "Integrated Passive Devices with Enhanced Form Factor," the entire contents of which is incorporated by reference herein.

For simplicity, the capacitors 100, 200 described herein are presented as being manufactured as discrete devices. However, the disclosure is not intended to be limited in this respect, and the capacitors 100, 200 may also be manufactured at the grid or panel level. For example, the capacitors 100, 200 may be incorporated into embeddable tiles as described in Applicant's own U.S. patent application Ser. No. 18/408,914, filed Jan. 10, 2024 and entitled "Embeddable Tiles Containing Passive Devices for Packaged Semiconductor Devices," the entire contents of which is incorporated by reference herein.

As described herein, the conductive substrate 110, 210 serving as a first electrode (e.g., anode), may be made of a material that is etched (e.g., plasma etched) or otherwise modified to have a high surface area, such as an etched aluminum foil as described in the '888 publication. Alternative or additional modifications to increase the surface area of the conductive substrate 110, 210 may include deposition of a sintered aluminum powder or other aluminum, aluminum oxide, titanium, or titanium oxide powder thereon. The conductive substrate 110, 210 may be a metal foil as described in Applicant's own U.S. Patent Application Pub. No. 2023/0073898 ("the '898 publication"), entitled "Modified Metal Foil Capacitors and Methods for Making Same," the entire contents of which is incorporated by reference herein.

In general, the disclosed capacitors 100, 200 may represent an embedded solution to reduce 12R losses by providing a shorter conduction path closer to the load, thereby improving inductance and reducing inductance loops to allow the capacitors 100, 200 to access higher frequencies. The disclosed capacitors 100, 200 also may minimize heated or otherwise affected zones by avoiding laser ablation and may maximize cathode effective area by avoiding the need for through via and blind via connections. This may advantageously reduce resistance contributions from alternative capacitors' building blocks. At a panel level, the disclosed capacitors 100, 200 may allow the creation of a multi-domain approach on the same panel with thicknesses of less than 90 µm or even less than 75 µm. In addition, the disclosed capacitors 100, 200 may provide the flexibility to implement multiple stacking approaches.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of manufacturing a capacitor embeddable in a substrate core of a semiconductor device, the method comprising:
   providing a conductive substrate having a front side and a back side;
   providing a conductive polymer layer on a dielectric layer formed on the front side of the conductive substrate, wherein the dielectric layer is conformal with a high surface area (HSA) portion of the conductive substrate on the front side of the conductive substrate;
   providing a carbonaceous layer on the conductive polymer layer;
   providing a front metallization layer on the carbonaceous layer, the front metallization layer being electrically connected to the conductive polymer layer;
   providing a back metallization layer on the back side of the conductive substrate, the back metallization layer being electrically connected to the conductive substrate;
   removing the HSA portion of the conductive substrate in one or more regions of the front side of the conductive substrate to produce a plurality of isolated islands of the HSA portion having the dielectric layer conformal therewith; and
   providing a plurality of electrically isolated stacks respectively on the plurality of isolated islands, each of the stacks including a portion of the conductive polymer layer, a portion of the carbonaceous layer, and a portion of the front metallization layer.

2. The method of claim 1, further comprising applying a dielectric fill between the plurality of isolated islands.

3. The method of claim 1, wherein said providing the plurality of electrically isolated stacks comprises applying a continuous conductive polymer layer, a continuous carbonaceous layer, and a continuous front metallization layer over the plurality of isolated islands and subsequently removing one or more portions of the continuous conductive polymer layer, the continuous carbonaceous layer, and the continuous front metallization layer between the plurality of isolated islands.

4. The method of claim 1, wherein said providing the plurality of electrically isolated stacks comprises selectively applying the conductive polymer layer, the carbonaceous layer, and the front metallization layer on the plurality of isolated islands.

5. A method of manufacturing a capacitor embeddable in a substrate core of a semiconductor device, the method comprising:
   providing a conductive substrate having a front side and a back side;
   providing a conductive polymer layer on a dielectric layer formed on the front side of the conductive substrate;
   providing a carbonaceous layer on the conductive polymer layer;
   providing a front metallization layer on the carbonaceous layer, the front metallization layer being electrically connected to the conductive polymer layer;
   providing a back metallization layer on the back side of the conductive substrate, the back metallization layer being electrically connected to the conductive substrate; and
   removing a high surface area (HSA) portion of the conductive substrate, the conductive polymer layer, the carbonaceous layer, and the front metallization layer in one or more regions of the front side of the conductive substrate to produce a plurality of isolated stacks.

6. A method of manufacturing a capacitor embeddable in a substrate core of a semiconductor device, the method comprising:
   providing a conductive substrate having a front side and a back side;
   providing a conductive polymer layer on a dielectric layer formed on the front side of the conductive substrate;
   providing a carbonaceous layer on the conductive polymer layer;
   providing a front metallization layer on the carbonaceous layer, the front metallization layer being electrically connected to the conductive polymer layer;
   providing a back metallization layer on the back side of the conductive substrate, the back metallization layer being electrically connected to the conductive substrate; and
   removing a high surface area (HSA) portion of the conductive substrate from the back side of the conductive substrate, the back metallization layer being provided on a solid metal portion of the conductive substrate on the back side of the conductive substrate.

7. The method of claim 1, further comprising electrically connecting the front and back metallization layers to metal routing layers of a package substrate that includes the substrate core.

8. The method of claim 7, wherein said electrically connecting the front and back metallization layers to the metal routing layers of the package substrate includes providing plating to a metal plane on the substrate core.

9. The method of claim 1, wherein the conductive substrate comprises an etched aluminum foil.

10. The method of claim 9, wherein the dielectric layer comprises aluminum oxide.

11. The method of claim 1, wherein the front metallization layer includes a diffusion barrier layer.

12. The method of claim 1, wherein the capacitor comprising the conductive substrate, the conductive polymer layer, the carbonaceous layer, the front metallization layer, and the back metallization layer has a thickness of less than 90 μm.

13. The method of claim 12, wherein the thickness is less than 75 μm.

14. The method of claim 1, further comprising embedding the capacitor comprising the conductive substrate, the conductive polymer layer, the carbonaceous layer, the front metallization layer, and the back metallization layer in the substrate core of a package substrate of the semiconductor device.

15. The method of claim 1, further comprising embedding a plurality of the capacitor comprising the conductive substrate, the conductive polymer layer, the carbonaceous layer, the front metallization layer, and the back metallization layer in the substrate core of a package substrate of the semiconductor device.

16. The method of claim 1, further comprising embedding the capacitor comprising the conductive substrate, the conductive polymer layer, the carbonaceous layer, the front metallization layer, and the back metallization layer in the substrate core of an interposer of the semiconductor device.

17. The method of claim 5, further comprising electrically connecting the front and back metallization layers to metal routing layers of a package substrate that includes the substrate core.

18. The method of claim 5, further comprising embedding the capacitor comprising the conductive substrate, the conductive polymer layer, the carbonaceous layer, the front metallization layer, and the back metallization layer in the substrate core of a package substrate of the semiconductor device.

19. The method of claim 6, further comprising electrically connecting the front and back metallization layers to metal routing layers of a package substrate that includes the substrate core.

20. The method of claim 6, further comprising embedding the capacitor comprising the conductive substrate, the conductive polymer layer, the carbonaceous layer, the front metallization layer, and the back metallization layer in the substrate core of a package substrate of the semiconductor device.

* * * * *